United States Patent
Zadeh et al.

(10) Patent No.: US 11,202,021 B2
(45) Date of Patent: Dec. 14, 2021

(54) PULSE-FREQUENCY MODULATION (PFM) DIGITAL PIXEL UNIT-CELL INCLUDING DUAL-MODE GAIN SELECTION

(71) Applicant: RAYTHEON COMPANY, Waltham, MA (US)

(72) Inventors: Ali E. Zadeh, Sierra Madre, CA (US); Eric J. Beuville, Goleta, CA (US); Joshua J. Cantrell, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 40 days.

(21) Appl. No.: 16/697,742

(22) Filed: Nov. 27, 2019

(65) Prior Publication Data
US 2021/0160442 A1 May 27, 2021

(51) Int. Cl.
| | |
|---|---|
| *H04N 5/335* | (2011.01) |
| *H04N 5/3745* | (2011.01) |
| *H04N 5/378* | (2011.01) |
| *H01L 27/146* | (2006.01) |

(52) U.S. Cl.
CPC ......... *H04N 5/3355* (2013.01); *H04N 5/378* (2013.01); *H04N 5/37455* (2013.01); *H01L 27/14609* (2013.01)

(58) Field of Classification Search
CPC .................................................. H04N 5/3355
See application file for complete search history.

(56) References Cited

U.S. PATENT DOCUMENTS

| | | | | |
|---|---|---|---|---|
| 2012/0097856 A1* | 4/2012 | Chappo | ................. | G01T 1/2018 250/363.01 |
| 2014/0008521 A1* | 1/2014 | Rostaing | ............ | H04N 5/35536 250/208.1 |

OTHER PUBLICATIONS

Abbasi et al., "A PFM Based Digital Pixel with Off-Pixel Residue Measurement for Small Pitch FPAs" Circuits and Systems II: Express Briefs, IEEE Transactions on PP(99) (Sep. 2016) (5 pages).
Ceylan et al., "Implementation of pixel level digital TDI for scanning type LWIR FPAs" Infrared Technology and Applications XL. vol. 9070. International Society for Optics and Photonics (Jul. 1, 2014) (7 pages).
Schultz et al., "Digital-pixel focal plane array technology" Lincoln Laboratory Journal vol. 20 No. 2 (Aug. 2014): pp. 36-51.
(Continued)

*Primary Examiner* — Thanh Luu
(74) *Attorney, Agent, or Firm* — Cantor Colburn LLP (57) ABSTRACT

A digital unit-cell included in an imaging system includes a light sensor configured to generate an electrical charge in response to receiving light, and an energy storage circuit configured to establish a first parasitic capacitance and second large capacitance to store the electrical charge. The digital unit-cell further includes a gain selection circuit and a dual-mode comparator. The gain selection circuit is configured operate in a first mode to invoke the first capacitance and a second mode to invoke the second capacitance. The dual-mode comparator is configured to operate in a first reset mode that generates a first reset signal having a first pulse duration and a second reset mode that generates a second reset signal having a second pulse duration that is a longer than the first pulse duration.

15 Claims, 9 Drawing Sheets

(56) References Cited

OTHER PUBLICATIONS

Tsai et al., "Analysis of dynamic range, linearity, and noise of a pulse-frequency modulation pixel" IEEE Transactions on Electron Devices vol. 59 No. 10 (Oct. 10, 2012): pp. 2675-2681.
Wang et al., "A high dynamic range CMOS image sensor with inpixel light-to-frequency conversion" IEEE Transactions on electron devices vol. 53 No 12 (Dec. 12, 2006): pp. 2988-2992.

* cited by examiner

PULSE-FREQUENCY MODULATION (PFM) DIGITAL PIXEL UNIT-CELL INCLUDING DUAL-MODE GAIN SELECTION

BACKGROUND

The present disclosure relates to imaging systems, and more particularly, to a digital pixel unit-cell included in an image capturing device.

Image sensors used in image capturing devices generate charge in proportion to light intensity received at the image sensor from a scene viewed by the image sensor. There are two types of digital pixel architectures presented in the state of the art image sensors. A first conventional topology has a small integrating capacitor (in the order of few femtofarad, fF), i.e. high gain mode, for which noise is limited by the quantization noise. Quantization noise has a value equal to LSB/$\sqrt{12}$, where the least significant bit (LSB) is defined as charge integrated on the integration capacitor per count. The well size of the in-pixel digital is limited by the number of counter bits and the area available in the small pixel footprint.

A second topology is the residue digital pixel with larger integrating capacitor (100 fF or so), i.e. low gain mode. In addition to the in-pixel counter bits, a column analog-to-digital converter (ADC) converts the residue voltage left on the integration capacitor into additional digital bits. In terms of residue digital pixel topology, the resolution is limited by the column ADC bit resolution offering an overall much lower noise than conventional digital pixels.

SUMMARY

According to a non-limiting embodiment, a digital unit-cell included in an imaging system comprises a light sensor configured to generate an electrical charge in response to receiving light, and an energy storage circuit configured to establish a first parasitic capacitance and second large capacitance to store the electrical charge. The digital unit-cell further includes a gain selection circuit and a dual-mode comparator. The gain selection circuit is configured operate in a first mode to invoke the first capacitance and a second mode to invoke the second capacitance. The dual-mode comparator is configured to operate in a first reset mode that generates a first reset signal having a first pulse duration and a second reset mode that generates a second reset signal having a second pulse duration that is a longer than the first pulse duration.

According to another non-limiting embodiment, a dual-mode comparator circuit included in a digital unit-cell of an imaging system comprises an oscillator circuit and a reset pulse control circuit. The oscillator circuit is configured to operate in a first reset mode to generate a first reset signal having a first pulse duration and a second reset mode to generate a second reset signal having a second pulse duration that is a longer than the first pulse duration. The reset pulse control circuit is in signal communication with the oscillator circuit and is configured to deliver a first current to the oscillator circuit in response to invoking the first reset mode and to deliver a second current that is less than the first current in response to invoking the second reset mode.

According to yet another non-limiting embodiment, a method of selectively operating a digital unit-cell in a plurality of different modes. The method comprises generating, via a light sensor, an electrical charge in response to receiving light, and establishing, via an energy storage circuit, a first capacitance and second capacitance to store the electrical charge. The method further comprises operating a gain selection circuit in a first mode to invoke the first capacitance and a second mode to invoke the second capacitance. The method further comprises operating a dual-mode comparator in a first reset mode that generates a first reset signal having a first pulse duration and a second reset mode that generates a second reset signal having a second pulse duration that is a longer than the first pulse duration.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Digital pixels provide a direct digital output signal that can significantly improve the charge-handling capability of Focal Plane Array (FPA) compared to their analog pixel counterparts. A digital pixel unit-cell typically includes a pulse-frequency modulation (PFM) feedback loop that controls multiple self-reset operations that substantially affect the performance characteristics of the pixel. Controlling the reset-pulse duration to achieve a targeted time value is an important parameter when designing a digital pixel unit-cell.

The duration of the self-reset pulse is controlled by a comparator circuit (sometimes referred to as a reset comparator) implemented in the PFM digital pixel unit-cell. The reset comparators implemented in conventional digital pixel are designed to generate a very short pulse duration to reset the small integration capacitor, i.e. high gain, and for residue digital pixel, a much longer reset-pulse duration is needed to reset the large integration capacitor, i.e. low gain.

In one or more non-limiting embodiments described herein, an imaging system includes a PFM digital unit-cell that implements a dual-mode comparator circuit. The dual-mode comparator circuit described herein allows for selectively operating a PFM digital unit-cell in both of a low-gain mode or a high-gain mode. For example, the dual-mode comparator selectively invokes two different reset-pulse signals: either a first reset-pulse signal having a duration of about 2 nanoseconds (ns) to about 4 ns to invoke a low-gain mode; or a second reset-pulse signal having a duration ranging from about 100 picoseconds (ps) to about 200 ps to invoke a high-gain mode. In one or more embodiments, the dual-mode comparator employs biased controlled transistor devices capable of operating in two modes or states (e.g., a linear resistor mode or a current starving mode) to invoke either the high-gain mode or the low-gain mode.

Figure 1:
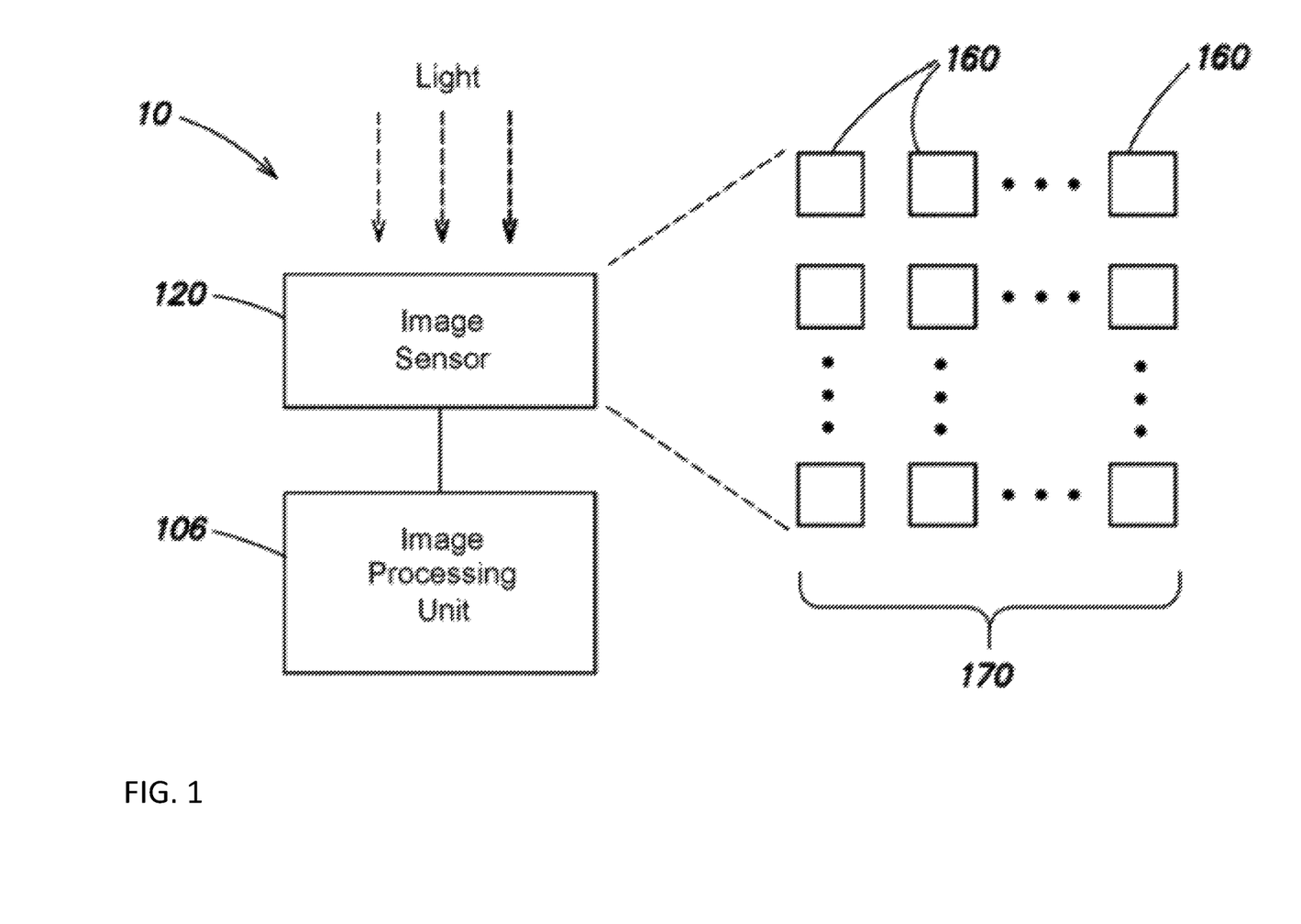
FIG. 1 is a block diagram illustrating an imaging system capable of capturing images according to a non-limiting embodiment.

Turning now to FIG. 1, a block diagram illustrating an image capture device 10 that may be used to capture images according to aspects described herein. For example device 10 may be a digital camera, video camera, or other photographic and/or image capturing equipment. Image capture device 10 comprises an image sensor 120 and an image processing unit 106. The image sensor 120 may be an Active Pixel Sensor (APS) or other suitable light sensing device that can capture images. The image processing unit 106 may be a combination of hardware, software, and/or firmware that is operable to receive signal information from the image sensor 120 and convert the signal information into a digital image. The image processing unit 106 can also include an electric hardware controller configured to generate one or more control signals (e.g., a gain control signal, a comparator reset signal, etc.) that control various circuitry included in the unit-cell(s) 160.

The image sensor 120 includes an array 170 of unit-cells 160. Each unit-cell 160 accumulates charge proportional to the light intensity at that location in the field of view and provides an indication of the intensity of light at that location to the image processing unit 106. Each unit-cell 160 may correspond to a pixel in the captured electronic image.

Figure 2:
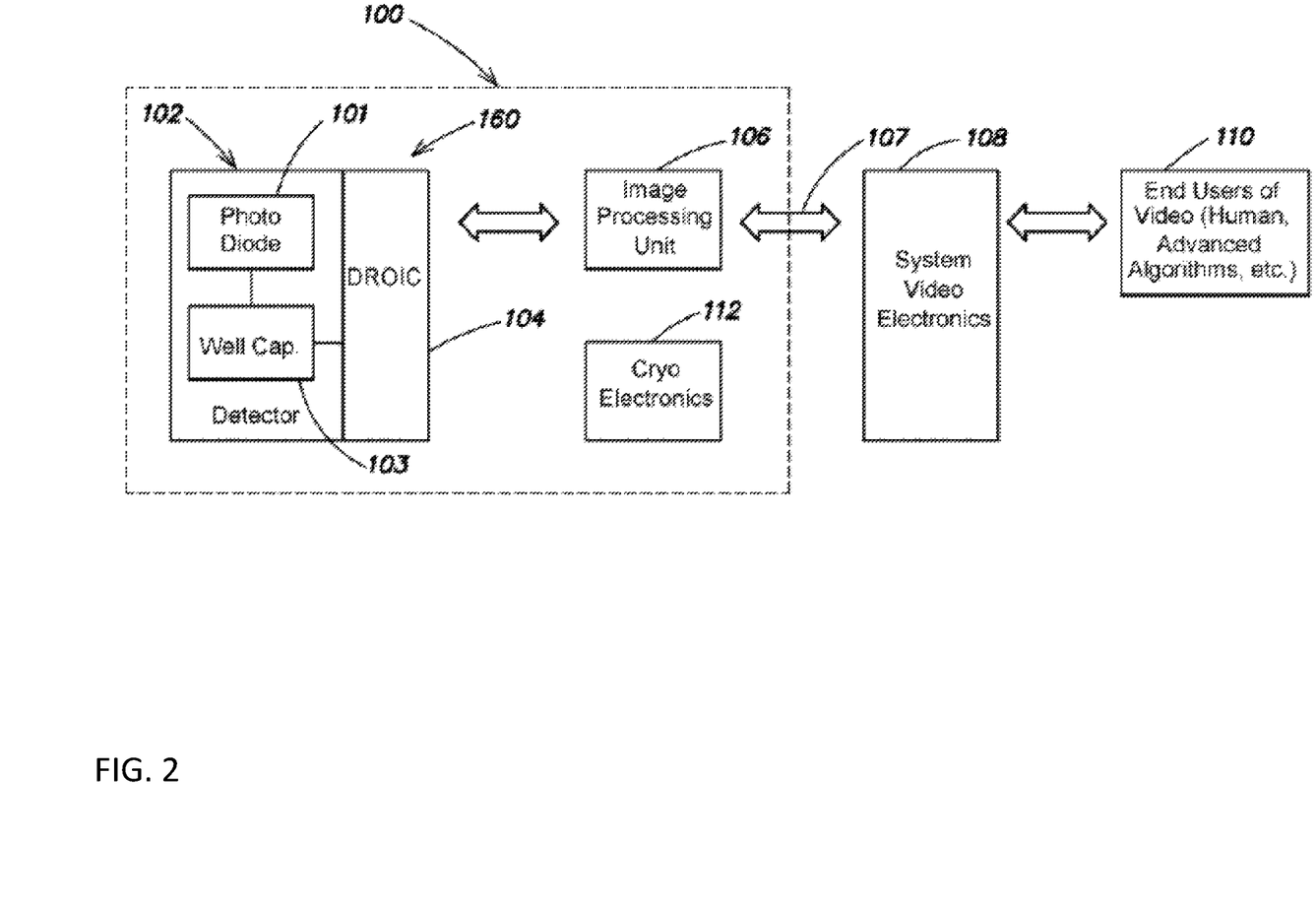
FIG. 2 is a block diagram illustrating a digital pixel circuit including a digital unit-cell according to a non-limiting embodiment.

Turning to FIG. 2, a block diagram illustrating a digital pixel circuit 100 according to aspects described herein. The digital pixel circuit 100 includes one of the unit-cells 160 and the image processing unit 106. The unit-cell 160 includes an image detector 102 and a digital readout integrated circuit (DROIC) 104. The image detector 102 includes a light sensor 101, an energy storage device 103 coupled to the light sensor 101, and other components, as discussed above. The image detector 102 is coupled to a corresponding DROIC 104. The energy storage device 103 includes, for example, an integration capacitor 103, and the light sensor 101 includes, for example, a photodiode 101. The DROIC 104 is coupled to the image processing unit 106. Although the DROIC 104 and the imaging processing unit 106 are shown as separate components, it should be appreciated that other embodiments allow for a DROIC 104 that can perform the functions of the image processing unit 106 described above. The image processing unit 106 can be coupled to an external system video electronics module 108 via an interface 107. The electronics module can be controlled by end users or coupled to a higher-level system such as a camera system that can be mounted on the telescope, aircraft, etc.

Figure 3:
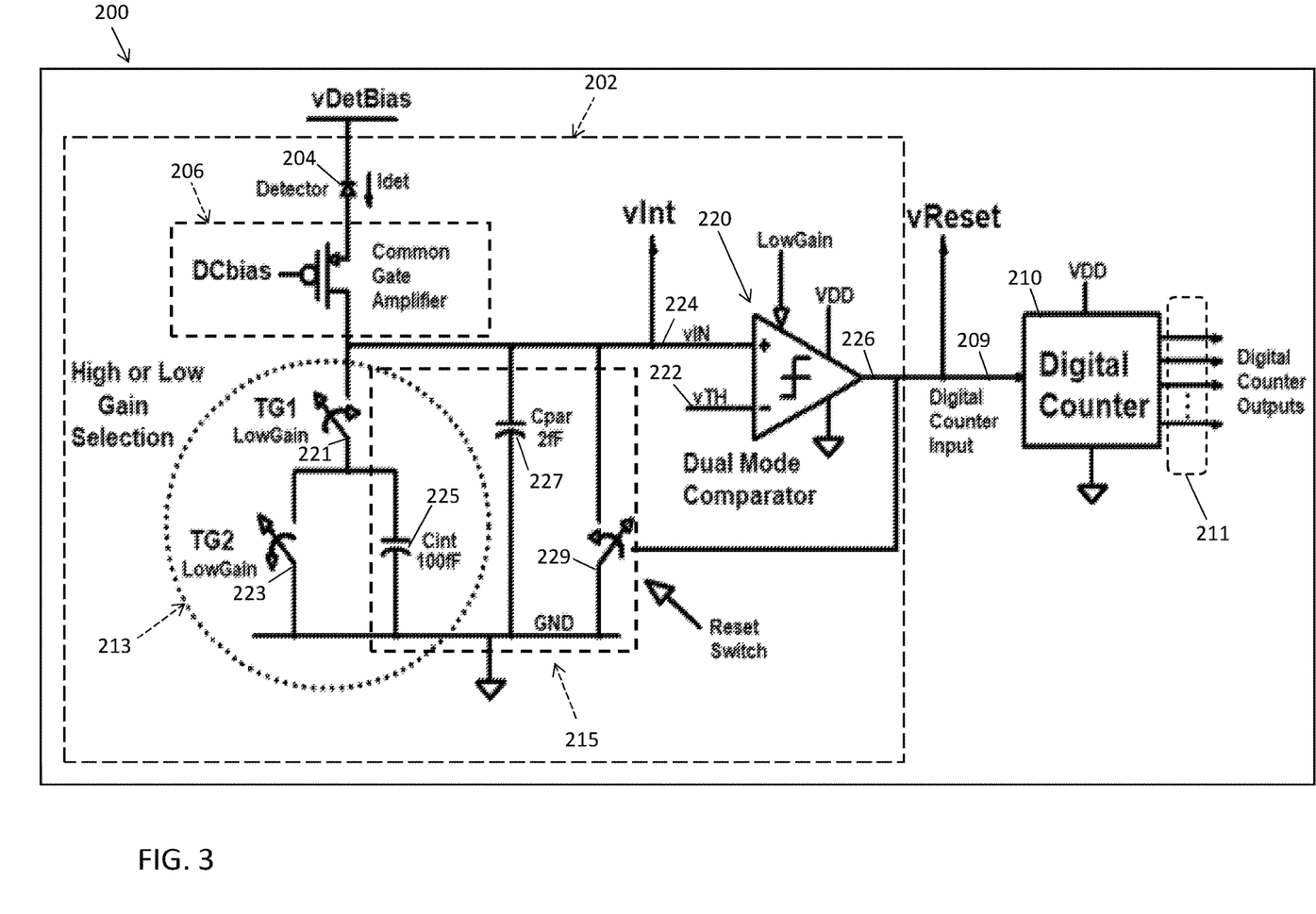
FIG. 3 is a schematic diagram of a pulse-frequency modulation (PFM) digital pixel unit-cell including a dual-mode gain selection circuit according to a non-limiting embodiment.

Referring to FIG. 3, a PFM digital pixel unit-cell 200 capable of being implemented in a digital pixel circuit 100 is illustrated according to a non-limiting embodiment. For example, the PFM digital pixel unit-cell 200 can be included one or more of the unit-cells 160 shown in FIG. 2. The PFM digital pixel unit-cell 200 includes an input circuit 202, and a counter 210.

The input circuit 202 includes a photodetector 204, a detector input circuit 206 and a dual-mode comparator 220. The photodetector 204 is in signal communication with the detector input circuit 206. According to a non-limiting embodiment, the detector input circuit 206 is a direct injection (DI) circuit. In other embodiments, a different type of input circuit (e.g., a capacitor trans-impedance amplifier (CTIA)) can be utilized. The counter 210 includes an input 209 for receiving a reset signal output by the dual-mode comparator, and an output 211. The output 211 can be connected to an image processing unit (e.g., image processing unit 106) to generate a digital image.

The photodetector 204 is configured to receive light from a viewed scene. The received light causes the PFM digital pixel unit-cell 200 to accumulate an electric charge proportional to the light intensity at its location. The electric charge is effectively integrated in the PFM digital pixel unit-cell 200 producing a voltage that corresponds to the intensity of the flux over a given time interval called an integration interval or integration time. When the integrated charge exceeds a threshold level, additional circuitry inside the PFM digital pixel unit-cell 200 removes the integrated charge (e.g., resets the accumulated charge) while the counter 210 tracks each reset by incrementing a counter value. After the integration node is reset (i.e., each time the reset switch 229 is activated to induce a discharge from the unit-cell) and the counter incremented, the integration of charge in the PFM digital pixel unit-cell 200 begins again.

The PFM digital pixel unit-cell 200 includes a gain selection circuit 213 and an energy storage circuit 215, which facilitate the integrated charge in the PFM digital pixel unit-cell 200. The gain selection circuit 213 includes a first gain selection switch 221 and a second gain selection switch 223. The energy storage circuit 215 includes an integration capacitor 225 that is selectively connected in parallel with a parasitic capacitance 227. The parasitic capacitance 227 is all parasitic capacitors tied to node 224 and ground. The integration capacitor 225 is connected to ground and one terminal of the first gain selection switch 221. The opposing end of the first gain selection switch 221 is connected in common with the detector input circuit 206, the dual-mode comparator 220, and the parasitic capacitance 227. In this manner the first gain selection switch 221 can selectively connect the integration capacitor 225 in parallel with the parasitic capacitance 227. For example, when the first gain selection switch 221 is closed, the integration capacitor 225 is connected in a parallel with the parasitic capacitance 227. Accordingly, the total capacitance available for accumulating charge delivered from the detector input circuit 206 includes the capacitance of the integration capacitor 225 (e.g., about 100 femtofarads (fF)) added to the parasitic capacitor 227 (e.g., about 2 fF). When, however, the first gain selection switch 221 is open, the integration capacitor 225 is disconnected from the detector input circuit 206 and the parasitic capacitance 227. Accordingly, the capacitance available for accumulating charge delivered from the detector input circuit 206 is that of the parasitic capacitor 227 (excluding the integration capacitor 225).

The dual-mode comparator 220 includes a first input terminal 224, a second input terminal 222, or reference terminal, and an output terminal 226. The reference terminal 222 receives a voltage level to establish an input voltage threshold (VTH). The input terminal 224 is the signal received from the detector input circuit 206 to establish an input voltage (VIN). The input terminal 224 is also in signal connection with the gain selection circuit 213 and the energy storage circuit 215. The dual-mode comparator 220 compares the input voltage (VIN) to the reference voltage threshold (VTH). Based on the comparison, the dual-mode comparator 220 generates the reset signal at the output terminal 226. The reset signal generated is then used to reset the integrated charge accumulated by the energy storage circuit 215.

Unlike comparators implemented in conventional unit-cells, the dual-mode comparator 220 operates in different modes so as to output different reset pulse signals. When the dual-mode comparator 220 operates in a low-gain mode, for example, the output terminal 226 outputs a first reset pulse signal having a long reset duration (e.g., ranging from about 2 ns to about 4 ns). When, however, the dual-mode comparator 220 operates in a high-gain mode, the output terminal 226 outputs a second reset pulse signal having a short duration (e.g., about 100 ps to about 200 ps). The operation of the dual-mode comparators 220 is described in greater detail below.

The gain selection circuit 213 is controlled via a controller (not shown) to adjust the voltage level applied to the second input terminal 224. When invoking the low-gain mode, the controller outputs a first gain control signal (a low state signal) that closes the first gain selection switch 221 while opening the second gain selection switch 223. As a result, a parallel combination of the integration capacitor 225 and the parasitic capacitor 227 will be established in the gain selection circuit 213 and a larger total capacitance (e.g., about 100 femtoFarads (fF)) will be established.

Figure 4A:
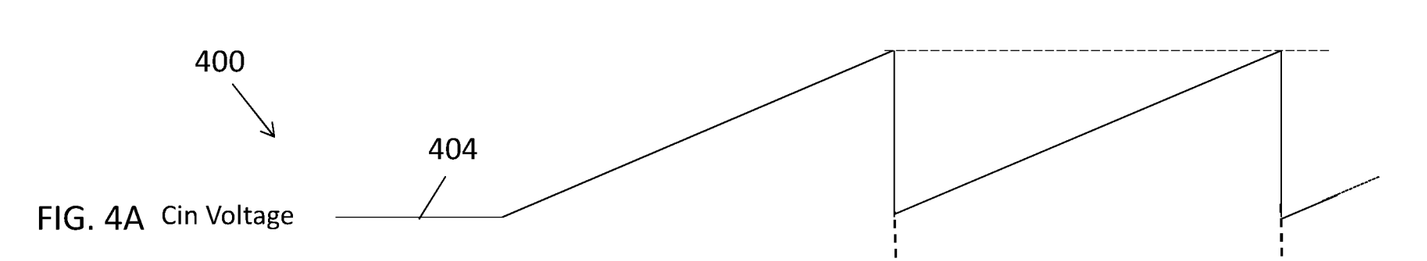
FIGS. 4A and 4B are signal graphs illustrating operation of a PFM digital unit-cell circuit in a low-gain mode according to a non-limiting embodiment.
Figure 4B:
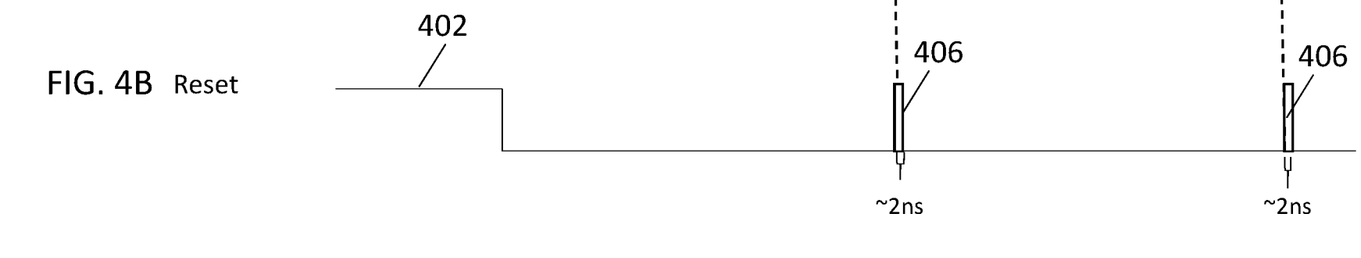

As optical radiation (e.g., an input light signal) from a scene is incident on the photodiode 204, a resulting photocurrent from the photodiode 204 is provided to the integration capacitor 225, via the detector input circuit 206, and charge corresponding to the flux of the optical radiation incident on the photodiode 204 accumulates on both of the integration capacitor 225 and the parasitic capacitor 227. The voltage across both the integration capacitor 225 and the parasitic capacitor 227 increases as charge accumulates. The voltage across the integration capacitors 225 and 227 is monitored by the dual-mode comparator 220. FIG. 4A is a trace 400 of the total voltage monitored by the dual-mode comparator 220. The integrated voltage signal 404 is shown ramping up until the reset pulse 406 of the reset signal 402 (see FIG. 4B) is generated by the dual-mode comparator 220, at which the time the integration capacitor 225 and the parasitic capacitor 227 each discharge, i.e. reset. The integration capacitor 225 and the parasitic capacitor 227 then again begin accumulated charge such that the combined voltage 404 again ramps up, and the process is repeated.

Figure 5A:
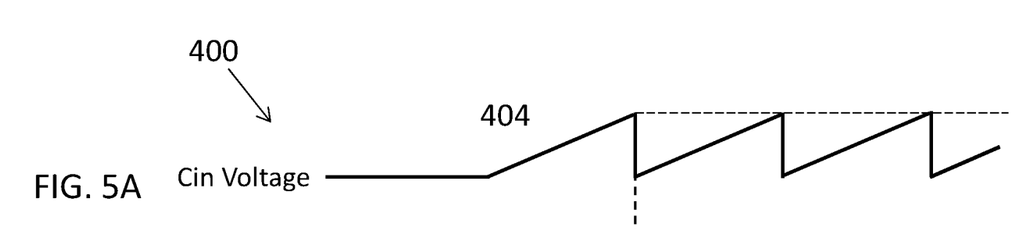
FIGS. 5A and 5B are signal graphs illustrating operation of a PFM digital unit-cell circuit in a high-gain mode according to a non-limiting embodiment.
Figure 5B:
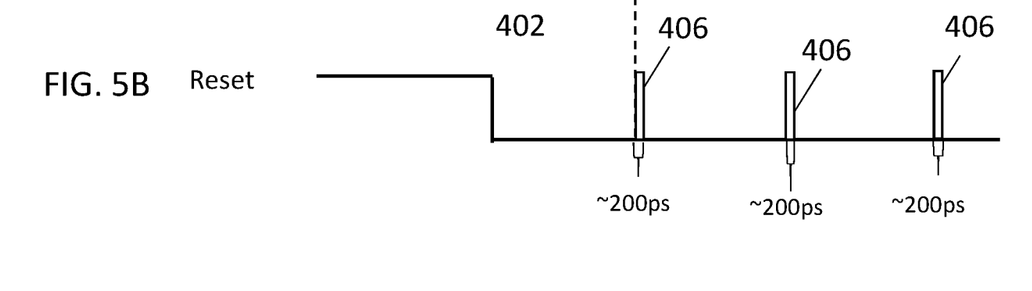

When invoking the high-gain mode, the controller outputs a second gain control signal (a high state signal) that opens the first gain selection switch 221 while closing the second gain selection switch 223. As a result, the integration capacitor 225 is disconnected while the parasitic capacitance 227 is maintained. The lower parasitic capacitance 227 (e.g., about 1 fF to about 2 fF) is established and the voltage is monitored by the dual-mode comparator 220. FIG. 5A is a trace 400 of the monitored voltage provided by the parasitic capacitance 227. The voltage 404 associated with the parasitic capacitance 227 ramps up until the reset pulse 406 (see FIG. 5B) is generated by the dual-mode comparator 220, at which the time the parasitic capacitor 227 discharges. The process is similar to the low-gain mode described above. In the high-gain mode, however, the pulse duration (e.g., 200 ps shown in FIG. 5B) of the reset pulse 406 is shorter compared to the reset pulse 406 generated during the low-gain mode (e.g. 2 ns shown in FIG. 4B) to keep the integration efficiency high (i.e. integration to reset ratio).

Figure 6A:
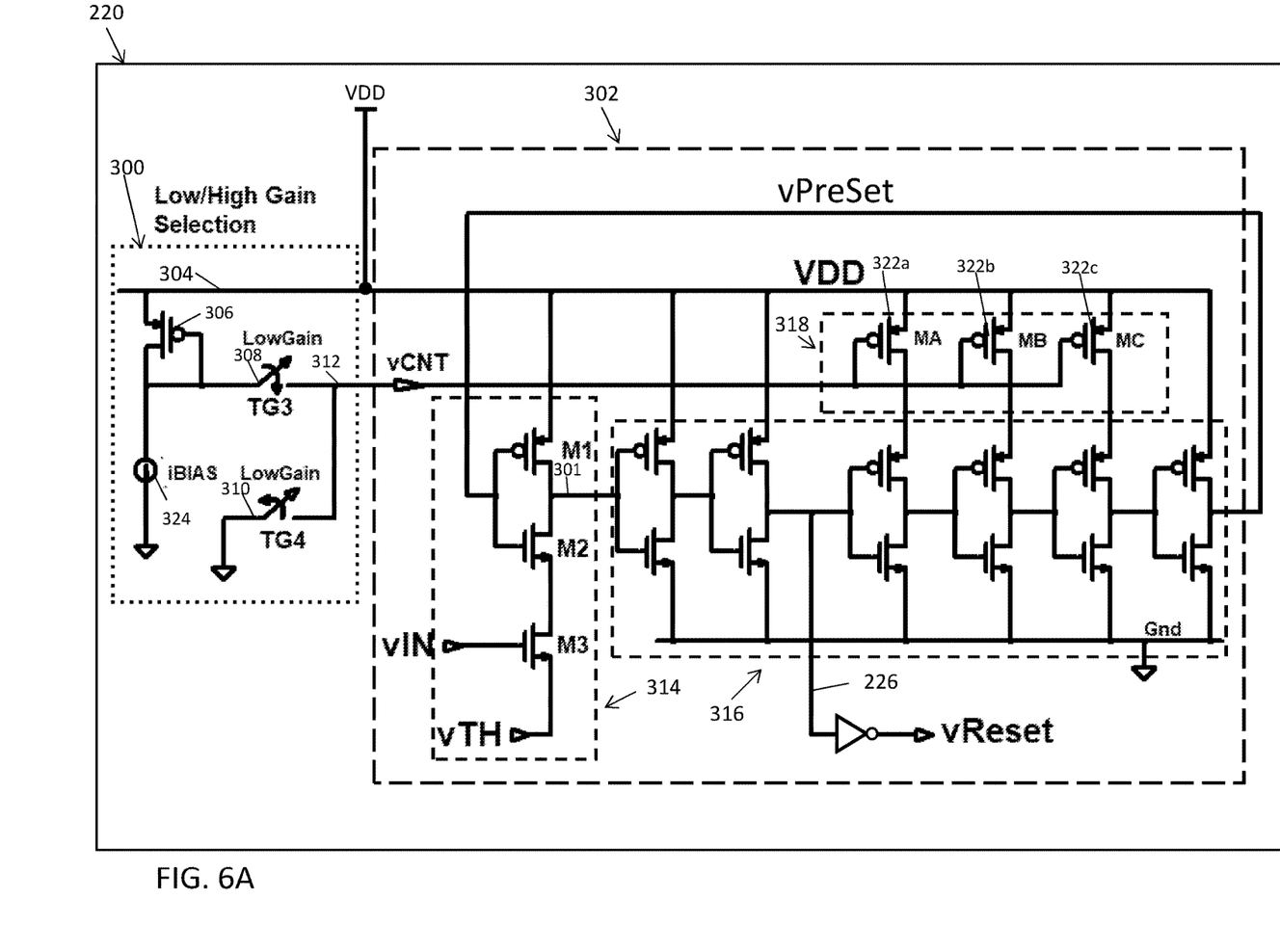
FIG. 6A is a schematic diagram of a dual-mode comparator circuit included in the PFM digital pixel unit-cell of FIG. 3 according to a non-limiting embodiment.

Referring to FIG. 6A, a circuit representing the dual-mode comparator 220 is illustrated according to a non-limiting embodiment. The dual-mode comparator 220 includes a multiplexer circuit 300 in signal communication with an oscillator circuit 302. The multiplexer circuit 300 and the oscillator circuit 302 are also each in signal communication with a supply voltage source (VDD) 304.

The selection circuit 300 establishes different signal paths to deliver different voltages that control the operating mode of the dual-mode comparator 220. In one or more embodiments, the Low/High gain selection circuit 300 includes a master bias transistor 306, mode selector switches 308 and 310, and a bias line 312. A controller (not shown in FIG. 6) outputs a gain control signal to control the state of the drive mode selector switches 308 and 310, which in turn invokes either the low-gain operating mode or the high-gain operating mode of the dual-mode comparator 220. The oscillator circuit 302 includes an input stage amplifier 314, a plurality of inverters that establish a ring oscillator 316, and a reset pulse control circuit 318. An external voltage (vTH) can be adjusted to the desired comparator threshold.

Figure 6B:
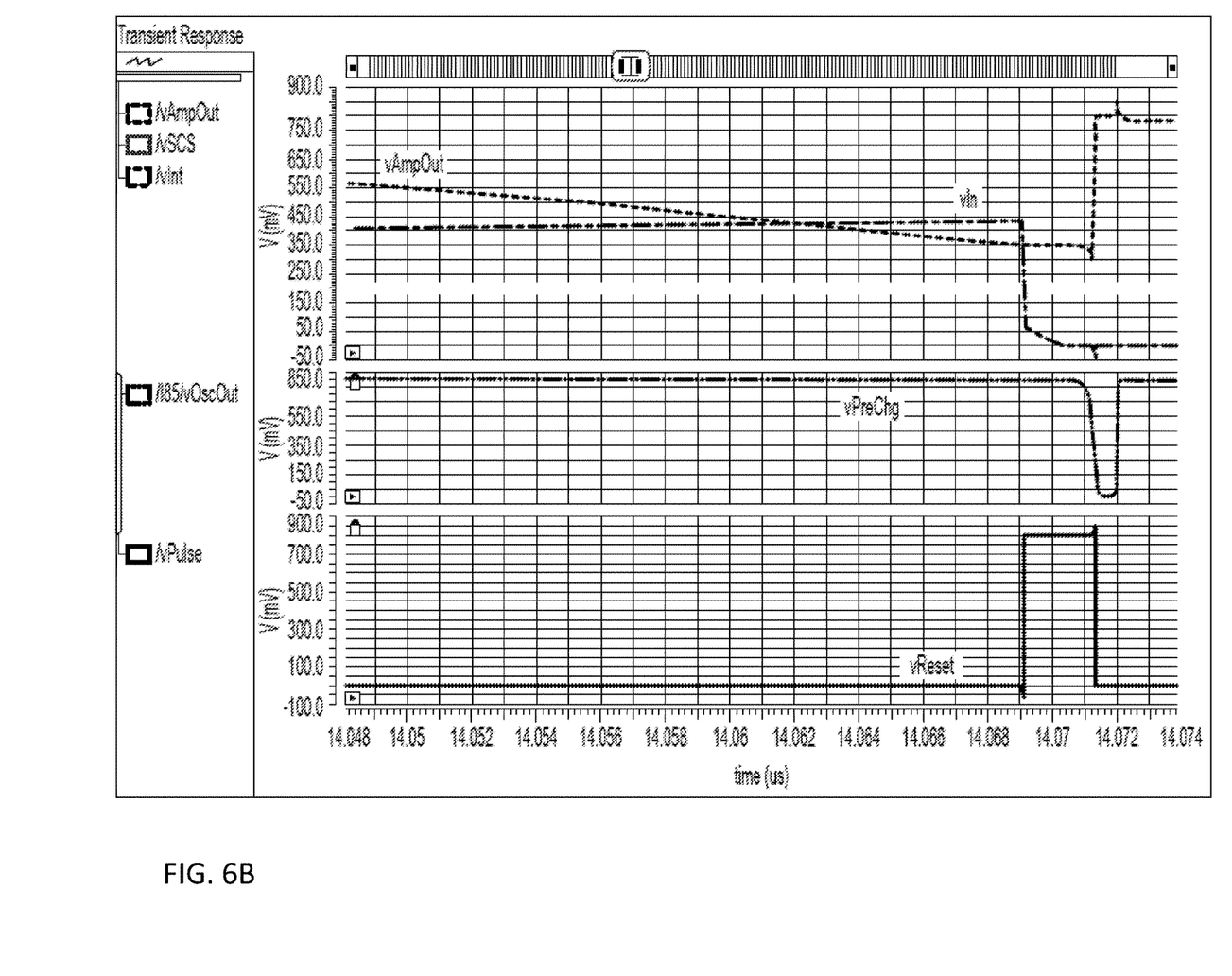
FIG. 6B is a signal diagram associated with the operation the dual-mode comparator circuit shown in FIG. 6A.

Still referring to FIG. 6A along with FIG. 6B, the operation of the operation of the dual-mode comparator 220 is described in greater detail. When integrating node voltage (vIn) exceeds the total threshold voltage (vTH+M3 common-source threshold), a reset pulse (vReset) is initiated and stays asserted until the duration of the entire ring-oscillator loop.

Once the ring-oscillator feedback loop is completed by the delays of inverters, the pre-charged signal (vPreChg) turns low, making reset pulse signal, vReset, to also go low, ending the reset-pulse duration. However, the output 301 (vAmpOut) of the common-source amplifier (M3 transistor) transitions to a high voltage stage such that the delay of the amplifier output will cause the pre-charged voltage (vPreChg) to return to its normal state of high. This operation process applies to both modes of operations: low-gain and the high-gain. In the low-gain mode, the duration of the vReset pulse needs to be much longer (few ns) than for the high gain mode (few 100 ps) due to a much larger charge on the integrated capacitor that needs to be fully drained, i.e. reset.

The reset pulse control circuit 318 includes mode transistors 322a, 322b and 322c that operate to invoke different reset modes of the dual-mode comparator 220, which correspond to the different gain modes (e.g., high gain mode or low gain mode) of the PFM digital pixel unit-cell 200. In one or more embodiments, the mode transistors 322a, 322b and 322c operate as either current inhibiting inverters (i.e., in a current inhibiting mode) or as linear resistors (i.e., in a linear resistor mode) in response to the signal applied at the drive output 312 of the multiplexer circuit 300. In turn, the operation of the mode transistors 322a, 322b and 322c controls the pulse duration of the reset pulse signal generated at the output 211 of the comparator.

The reset pulse width is adjusted by controlling the inverters 316 current limit. In high gain mode, transistors 322a, 322b and 322c are fully turned ON by pulling the vCNT node 312 to ground by the Low/High gain selection device 300. When inverters are running freely, their propagation delays are much shorter than when we limit their feeding currents. Those feeding currents charge up and down the internal capacitors of inverters at much slower pace. In the low gain mode, the inverter current limit transistors 322a, 322b and 322c are driven by the Low/High gain selection device 300, to a current limit defined by the ratio of the master bias transistor sizes 306 and current limit transistors 322a, 322b and 322c.

When invoking the low-gain mode, for example, the controller outputs the first gain control signal (a low state signal) that closes the first gain selection switch 221 while opening the second gain selection switch 223 (see FIG. 3). As a result, the parallel combination of the integration capacitor 225 and the parasitic capacitance 227 is established in the gain selection circuit 213 and a larger input voltage is delivered to the dual-mode comparator 220.

The first gain control signal also closes the first drive mode selector switch 308 while opening the second drive mode selector switch 310. Accordingly, a control voltage ($V_{CNT}$) is applied to the gates of mode transistors 322a, 322b and 322c, which saturates the mode transistors 322a, 322b and 322c and inhibits the magnitude of bias currents flowing through the transistors 322a, 322b and 322c (see FIG. 7). In other words, the saturated mode transistors 322a, 322b and 322c operate as current sources, which inhibit the current delivered into the ring oscillator 316. The magnitude of the bias current ($I_{BIAS}$) 324 sets the time delay in the current starving mode inverters 322a, 322b and 322c. Thus, the reset-pulse duration in this mode can be controlled by the magnitude of the programmable current ($I_{BIAS}$) 324.

When invoking the high-gain mode, for example, the controller outputs the second gain control signal (a high state signal) that closes the opens gain selection switch 221 and closes the second gain selection switch 223 (see FIG. 3). As a result, the integration capacitor 225 is disconnected while the parasitic capacitance 227 is maintained. Accordingly, a lower input voltage is delivered to the dual-mode comparator 220.

The second gain control signal also opens the first selector switch 308 while closing the second selector switch 310. As a result, the mode transistors 322a, 322b and 322c are directly connected to ground, thereby forcing the mode transistors 322a, 322b and 322c to operate in their triode region to operate as linear resistors (see FIG. 8). The resistance provided by the mode transistors 322a, 322b and 322c is low (e.g., 1 kilo-ohm (kΩ)), thereby delivering a greater amount of current into the ring oscillator 316 compared to the low-gain mode. The increased current generates a shorter reset-pulse duration (e.g., about 100 ps to about 200 ps) compared to the reset pulse duration (e.g. about 1 to 2 ns) generated during the low-gain mode.

Figure 9:
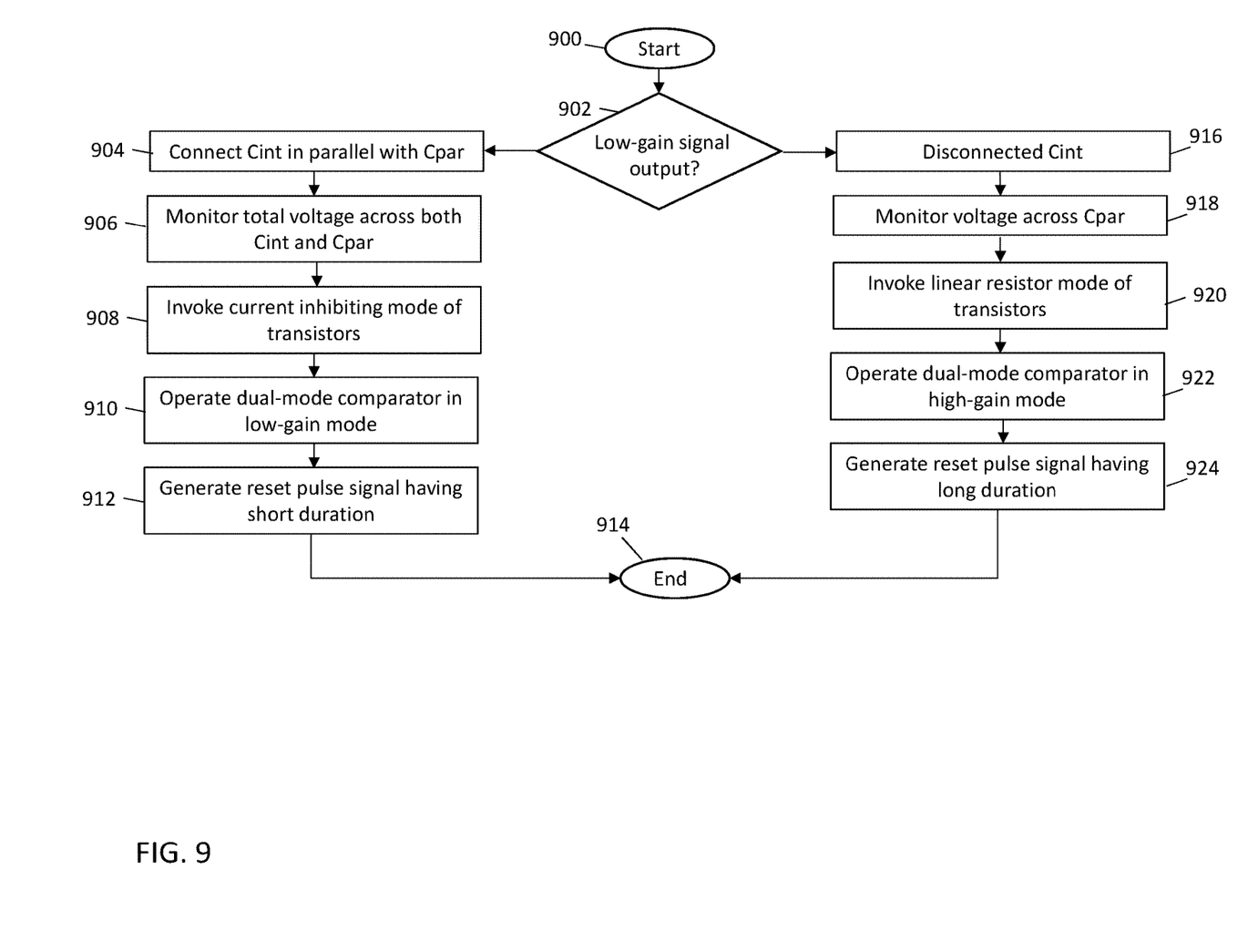
FIG. 9 is a flow diagram illustrating a method of selectively operating a PFM digital unit-cell in a low-gain mode or a high-gain mode according to a non-limiting embodiment.

Turning now to FIG. 9, a method of selectively operating a PFM digital unit-cell in a plurality of different modes according to a non-limiting embodiment. The method begins at operation 900, and a gain-mode control signal (e.g., a "LowGain" select signal) is output (e.g., via a controller) at operation 902. In one or more embodiments, the controller can output a low-logic signal that operates as a low-gain select signal to invoke a low-gain mode of the PFM digital unit-cell and a high-logic signal that operates as a high-gain signal to invoke a high-gain mode of the PFM digital unit-cell.

Figure 7:
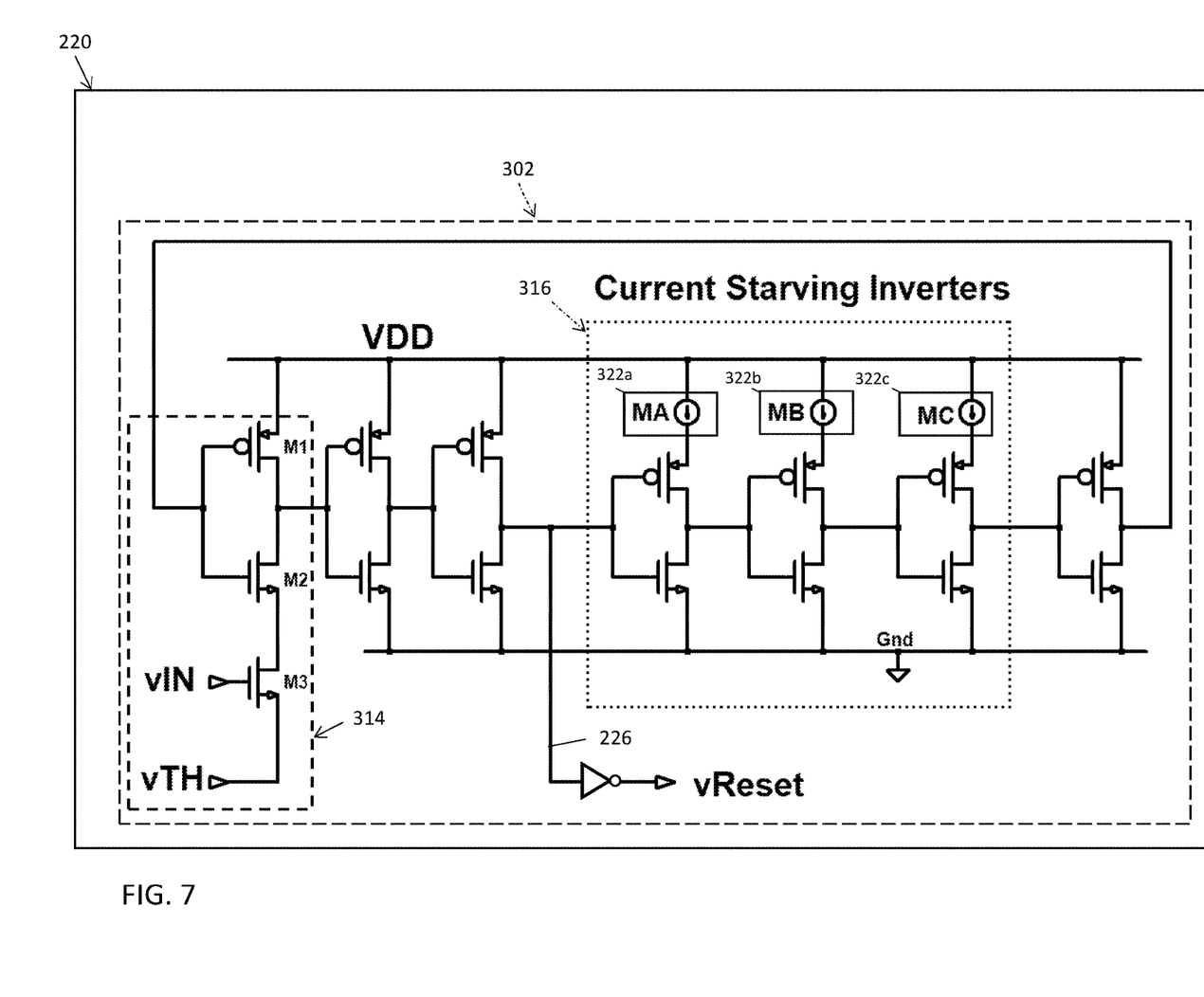
FIG. 7 is a schematic diagram of the dual-mode comparator circuit illustrated in FIG. 6 operating in a low-gain mode according to a non-limiting embodiment.

When the low-gain select signal is output, an integration capacitor 225 is connected in parallel (e.g., via a switch) with a parasitic capacitance 227 at operation 904 and a total voltage provided by the parallel combination of the integration capacitor 225 and the parasitic capacitor 227 is monitored (e.g., via dual-mode comparator 220) at operation 906. At operation 908, a current inhibiting mode of mode transistors 322a, 322b and 322c included in the dual-mode comparator 220 of the PFM digital unit-cell 200 is invoked at operation 908 (as illustrated in FIG. 7) such that a low-gain mode provided by the dual-mode comparator 220 is invoked at operation 910. Accordingly, the dual-mode comparator 220 generates a reset pulse signal having a short duration (e.g., about 100 ps to about 200 ps) at operation 912, and the method ends at operation 914.

Figure 8:
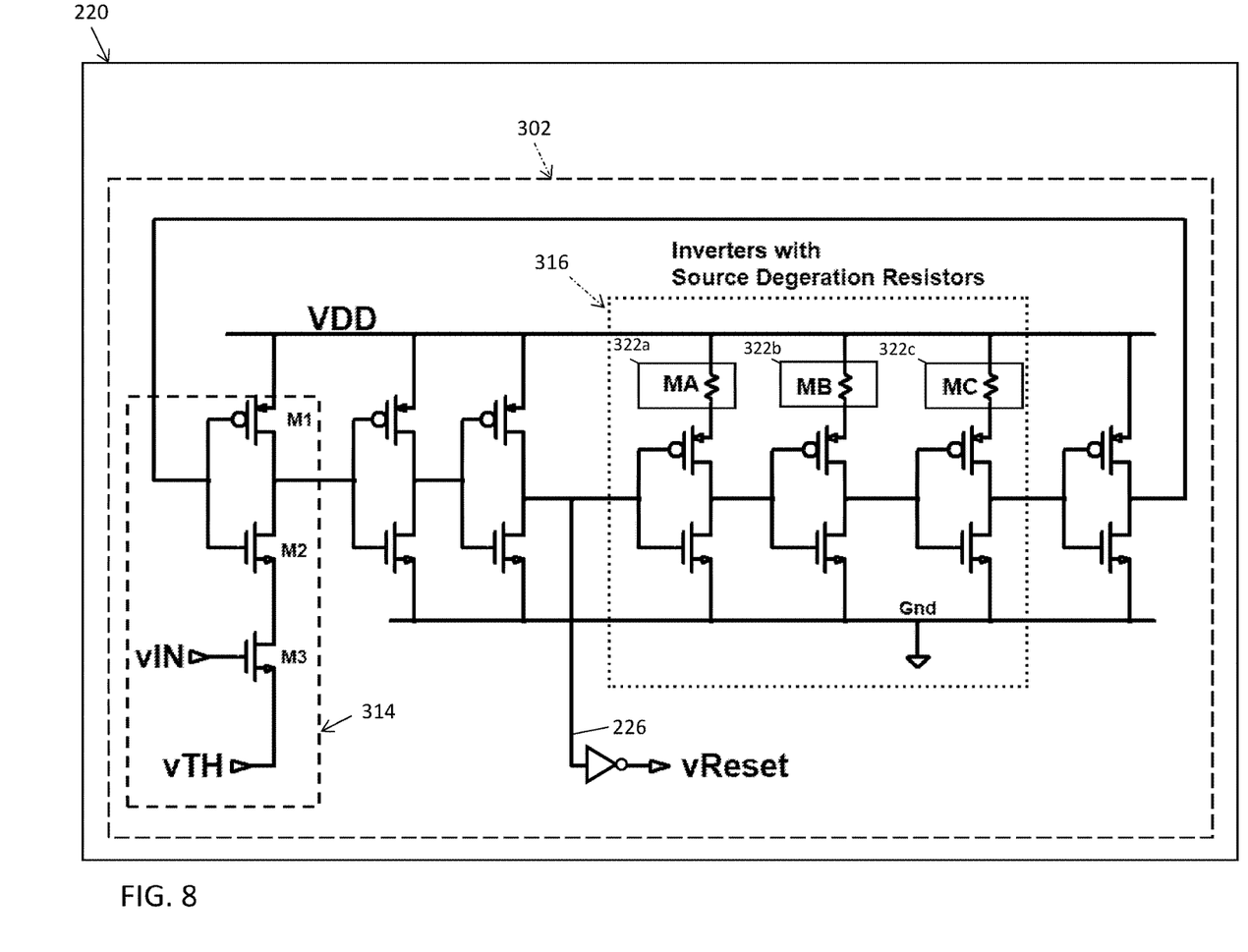
FIG. 8 is a schematic diagram of the dual-mode comparator circuit illustrated in FIG. 6 operating in a high-gain mode according to a non-limiting embodiment.

When, however, the low-gain signal is not output at operation 902 (i.e., a high-gain signal is instead output), the integration capacitor 225 is disconnected at operation 916, and the voltage associated with the parasitic capacitance 227 is monitored at operation 918. At operation 920, a linear resistor mode of the mode transistors 322a, 322b and 322c is invoked such that a high-gain mode of the dual-mode comparator 220 (as illustrated in FIG. 8) is invoked at operation 922. Accordingly, the dual-mode comparator 220 generates a reset pulse signal having a long duration (e.g., about 2 ns to about 4 ns) at operation 924, and the method ends at operation 914.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

A module can also be established as logic embodied in hardware or firmware, or to a collection of computer readable software instructions, written in a programming language including, but not limited to, VHDL, Verilog, Java, C, or assembly, and which is executed by one or more electronic microprocessors. One or more software instructions in the modules may be embedded in firmware, such as, for example, in an EPROM, and/or stored in any type of non-transitory computer-readable medium or other storage device.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A digital unit-cell included in an imaging system, the digital unit-cell comprising:
   a light sensor configured to generate an electrical charge in response to receiving light;
   an energy storage circuit configured to establish a first parasitic capacitance and second large capacitance to store the electrical charge;
   a gain selection circuit configured operate in a first mode to invoke the first capacitance and a second mode to invoke the second capacitance; and
   a dual-mode comparator configured to operate in a first reset mode that generates a first reset signal having a first pulse duration and a second reset mode that generates a second reset signal having a second pulse duration that is a longer than the first pulse duration.

2. The digital unit-cell of claim 1, further comprising a controller configured to output a first gain control signal that invokes the first mode of the gain selection circuit and the dual-mode comparator and a second gain control signal that invokes the second mode of the gain selection circuit.

3. The digital unit-cell of claim 2, wherein the controller outputs the first gain control signal in response to receiving a request to invoke a high-gain mode of the imaging system and outputs the second gain control signal in response to receiving a request to invoke a low-gain mode of the imaging system.

4. The digital unit-cell of claim 3, wherein the energy storage circuit comprises an integration capacitor selectively connectable in parallel with a parasitic capacitance,
   wherein the gain selection circuit connects the integration capacitor in parallel with the parasitic capacitance in response to invoking the second mode, and disconnects the integration capacitor from the parasitic capacitance in response to invoking the first mode.

5. The digital unit-cell of claim 4, wherein the integration capacitor has a capacitance that is greater than the parasitic capacitance.

6. The digital unit-cell of claim 1, wherein the dual-mode comparator comprises:
   an oscillator circuit configured to output the first and second reset signals; and
   a reset pulse control circuit in signal communication with the oscillator circuit, the reset pulse control circuit configured to deliver a first current to the oscillator circuit in response to invoking the first reset mode and to deliver a second current that is less than the first current in response to invoking the second reset mode.

7. The digital unit-cell of claim 6, wherein the first current sets a first inverter time delay of the oscillator circuit that defines the first pulse duration of the first reset signal, and the second current sets a second inverter time delay that is longer than the first inverter time delay, the second inverter time delay defining the second pulse duration of the second reset signal.

8. The digital unit-cell of claim 7, wherein the reset pulse control circuit includes a plurality of transistors configured to operate as linear resistive elements that deliver the first current to the oscillator circuit in response to invoking the first reset mode, and to operate as current-inhibiting elements that deliver the second current to the oscillator circuit in response to invoking the second reset mode.

9. A method of selectively operating a digital unit-cell in a plurality of different modes, the method comprising:
   generating, via a light sensor, an electrical charge in response to receiving light;
   establishing, via an energy storage circuit, a first capacitance and second capacitance to store the electrical charge;
   operating a gain selection circuit in a first mode to invoke the first capacitance and a second mode to invoke the second capacitance; and
   operating a dual-mode comparator in a first reset mode that generates a first reset signal having a first pulse duration and a second reset mode that generates a second reset signal having a second pulse duration that is a longer than the first pulse duration.

10. The method of claim 9, further comprising outputting, via a controller, a first gain control signal that invokes the first mode of the gain selection circuit and the dual-mode comparator and a second gain control signal that invokes the second mode of the gain selection circuit.

11. The method of claim 10, further comprising outputting, via the controller, the first gain control signal in response to receiving a request to invoke a high-gain mode of the imaging system and the second gain control signal in response to receiving a request to invoke a low-gain mode of the imaging system.

12. The method of claim 11, wherein establishing the first and second capacitances comprises:
   connecting an integration capacitor in parallel with a parasitic capacitance in response to invoking the second mode; and
   disconnecting the integration capacitor from the parasitic capacitance in response to invoking the first mode.

13. The method of claim 9, wherein operating the dual-mode comparator in the first and second reset modes comprises:
   delivering a first current to an oscillator circuit in response to invoking the first reset mode;
   outputting, via an oscillator circuit, the first reset signal in response to invoking the first reset mode;
   delivering a second current that is less than the first current in response to the oscillator circuit in response to invoking the second reset mode; and
   outputting, via the oscillator circuit, the second reset signal in response to invoking the first reset mode.

14. The method of claim 13, wherein operating the dual-mode comparator in the first and second reset modes further comprises:
   setting a first inverter time delay of the oscillator circuit using the first current, the first inverter time delay defining the first pulse duration of the first reset signal; and
   setting a second inverter time delay that is longer than the first inverter time delay using the second current, the second inverter time delay defining the second pulse duration of the second reset signal.

15. The method of claim 14, wherein operating the dual-mode comparator in the first and second reset modes further comprises:

operating a plurality of transistors included the reset pulse control circuit as linear resistive elements that deliver the first current to the oscillator circuit in response to invoking the first reset mode; and operating the plurality of transistors as current-inhibiting elements that deliver the second current to the oscillator circuit in response to invoking the second reset mode.

* * * * *